(12) United States Patent
Saitou et al.

(10) Patent No.: US 9,723,754 B2
(45) Date of Patent: *Aug. 1, 2017

(54) GROUND STRUCTURE OF CONTROLLER MOUNTED IN CONSTRUCTION MACHINE

(71) Applicants: Tomohiro Saitou, Hiratsuka (JP); Masahiko Hosaka, Hiratsuka (JP)

(72) Inventors: Tomohiro Saitou, Hiratsuka (JP); Masahiko Hosaka, Hiratsuka (JP)

(73) Assignee: Komatsu Ltd., Minato-ku, Tokyo (JP)

( * ) Notice: Subject to any disclaimer, the term of this patent is extended or adjusted under 35 U.S.C. 154(b) by 68 days.

This patent is subject to a terminal disclaimer.

(21) Appl. No.: 13/816,658

(22) PCT Filed: Oct. 29, 2012

(86) PCT No.: PCT/JP2012/077837
§ 371 (c)(1),
(2) Date: Feb. 12, 2013

(87) PCT Pub. No.: WO2014/045461
PCT Pub. Date: Mar. 27, 2014

(65) Prior Publication Data
US 2014/0345935 A1    Nov. 27, 2014

(30) Foreign Application Priority Data

Sep. 20, 2012    (JP) ................................. 2012-207145

(51) Int. Cl.
*H05K 7/20* (2006.01)
*B60R 16/02* (2006.01)
(Continued)

(52) U.S. Cl.
CPC ......... *H05K 7/20409* (2013.01); *B60R 16/02* (2013.01); *B60R 16/0207* (2013.01);
(Continued)

(58) Field of Classification Search
CPC ............... H01L 23/467; H01L 23/4093; H01L 23/3672; H01L 21/4882; H01L 23/367;
(Continued)

(56) References Cited

U.S. PATENT DOCUMENTS 3,364,395 A * 1/1968 Donofrio et al. ........ 361/679.54
3,541,433 A * 11/1970 Davis ............................ 323/320
(Continued)

FOREIGN PATENT DOCUMENTS

CN    201248017 Y    5/2009
DE    19754694    6/1999
(Continued)

OTHER PUBLICATIONS

Office Action issued Oct. 20, 2014 from corresponding Chinese Patent Application No. 201280002470.0, 8 pages.
(Continued)

*Primary Examiner* — Pete Lee
(74) *Attorney, Agent, or Firm* — Fish & Richardson P.C.

(57) ABSTRACT

A ground structure of a controller that is mounted in a construction machine such as a dump truck and has a case having an upper surface on which a connector receiver hole for a receptacle connector to be received is provided includes: a cable harness that is provided by a plurality of cables including a ground cable and is connected to the receptacle connector; and a connecting portion for the ground cable to be connected, the connecting portion being provided near the connector receiver hole on the upper surface.

7 Claims, 6 Drawing Sheets

(51) Int. Cl.
*H05K 5/00* (2006.01)
*H01R 13/648* (2006.01)
*H02G 3/03* (2006.01)
*H02G 3/08* (2006.01)

(52) U.S. Cl.
CPC ......... *H01R 13/648* (2013.01); *H05K 5/0069* (2013.01); *H02G 3/03* (2013.01); *H02G 3/081* (2013.01)

(58) Field of Classification Search
CPC . H01L 23/3675; H01L 23/3677; H01L 23/40; H01L 23/4006; H01L 23/4012; H01L 23/36; H05K 7/2039; H05K 7/20854; H05K 7/209; H05K 7/20963; H05K 7/20409; H05K 7/20418; H05K 7/20154; H05K 7/20163; H05K 7/2049; H05K 2201/10393; H05K 7/2089; H05K 7/20909; H05K 7/20918; H05K 1/0218; H01C 1/084; H01G 2/08; F21V 29/71; F21V 29/74; G02B 6/4269; G11B 33/1426; H01F 27/22
USPC .......... 361/703, 709, 710, 679.54, 715, 753; 156/80.3, 185; 439/95
See application file for complete search history.

(56) References Cited

U.S. PATENT DOCUMENTS

| | | | |
|---|---|---|---|
| 4,025,139 A | 5/1977 | Martucci | |
| 4,145,075 A * | 3/1979 | Holzmann | H02G 3/0658 285/149.1 |
| 5,066,931 A * | 11/1991 | Thelissen | H01R 13/7195 333/182 |
| 5,608,611 A * | 3/1997 | Szudarek et al. | 361/753 |
| 6,437,245 B1 * | 8/2002 | Hayashi | 174/74 R |
| 6,595,789 B2 * | 7/2003 | Oota | H01R 13/5205 174/359 |
| 7,061,766 B2 * | 6/2006 | Wainwright | H05K 7/209 165/80.3 |
| 7,210,947 B1 * | 5/2007 | Fodero et | 439/95 |
| 7,288,717 B1 | 10/2007 | Lee | |
| 8,922,999 B2 * | 12/2014 | Lai | H01L 23/4006 165/185 |
| 2005/0281514 A1 * | 12/2005 | Oki et al. | 385/92 |
| 2008/0074846 A1 * | 3/2008 | Peng | H05K 7/20936 361/715 |
| 2008/0130232 A1 * | 6/2008 | Yamamoto et al. | 361/703 |

FOREIGN PATENT DOCUMENTS

| | | |
|---|---|---|
| JP | H02-109281 A | 4/1990 |
| JP | 2001-025136 A | 1/2001 |
| JP | 2005-143264 | 6/2005 |
| JP | 2005-143265 A | 6/2005 |

OTHER PUBLICATIONS

International Search Report mailed Dec. 4, 2012 from International Application No. PCT/JP2012/077837, 2 pages.

Office Action issued Nov. 10, 2016 from corresponding German Patent Application No. 112012005114.9, 12 pages, with English Translation.

* cited by examiner

# GROUND STRUCTURE OF CONTROLLER MOUNTED IN CONSTRUCTION MACHINE

CROSS-REFERENCE TO RELATED APPLICATIONS

This application claims priority to International Application No. PCT/JP2012/077837 filed on Oct. 29, 2012, which application claims priority to Japanese Application No. 2012-207145, filed on Sep. 20, 2012. The contents of the above applications are incorporated herein by reference in their entireties.

TECHNICAL FIELD

The present invention relates to a ground structure of a controller mounted in a construction machine. More specifically, the present invention relates to a ground structure of a case of a controller to a frame ground.

BACKGROUND ART

Controllers that accommodate an electronic circuit board and the like in a metallic case have been typically known in various fields (see, for instance, Patent Literature 1). A case used for such a controller is grounded to a frame ground for the purpose of, for instance, electromagnetic shielding of the interior electronic circuit board.

When being installed on a construction machine, the controller is attached to an attachment board on a vehicle body via an attachment provided on the case. A cable harness to be connected to the controller includes a ground cable for frame ground. The ground cable is drawn out of an end of the controller separately from the other cables. While the other cables are electrically connected to the electronic circuit board inside the controller via a connector, the ground cable is fastened to the attachment board through a terminal attached to an end thereof together with a mount of the case, so that the case is electrically conducted with the ground cable and is grounded to the frame ground.

CITATION LIST

Patent Literature

Patent Literature 1 JP-A-2005-143265

SUMMARY OF THE INVENTION

Problems to be Solved by the Invention

However, in the conventional arrangement, since the terminal of the ground cable is fastened to the attachment board together with the mount provided on the case, in order to do maintenance on the controller in a narrow work space, the fastening bolt has to be detached and the ground cable has to be completely detached from the jointed part while temporarily detaching the cable harness from controller, thereby requiring much time for the maintenance.

In addition, when the terminal of the ground cable is fastened together with the mount of the case, since the terminal is hidden, it is difficult to fasten the bolt while visually checking the connection between the terminal and the mount or between the terminal and the attachment board. Accordingly, the terminal may not be stably connected, resulting in failure for stably grounding the terminal to the frame ground.

An object of the invention is to provide a ground structure for a controller mounted in a construction machine, the ground structure being capable of facilitating maintenance of the controller and reliably grounding a case to a frame ground.

Means for Solving the Problems

A ground structure according to a first aspect of the invention is for a controller that is mounted in a construction machine and is provided with a case comprising a connector receiver hole for receiving a connector on a surface of the case, the ground structure including: a cable harness comprising a plurality of cables including a ground cable, the cable harness being connected to the connector; and a connecting portion for the ground cable to be connected, the connecting portion being provided near the connector receiver hole on the surface.

In a ground structure of a controller according to a second aspect of the invention, a plurality of heat release fins are provided on the surface, and a height of the connector is lower than a height of the heat release fins.

A ground structure according to a third aspect of the invention is for a controller that is mounted in a construction machine and is provided with a case comprising: a plurality of heat release fins provided on a surface of the case; and a connector receiver hole for receiving a connector being provided on the surface of the case, where: the surface is rectangular in a plan view, the plurality of heat release fins comprise a first heat release fin and a second heat release fin mutually intersected at an intersection and disposed in a crossing direction; the first heat release fin and the second heat release fin are continuous with each other and are provided to define a T-shape in an entirety thereof; three ends of the T-shape extending to two long-side edges and one short-side edge of the surface, the surface is defined thereon with a pair of first connector disposition faces each comprising a corner defined by the intersection and facing the long-side edge and one of the short-side edges; and a second connector disposition face provided outside an area defined by the first heat release fin and the second heat release fin and facing the other short-side edge of the surface, a plurality of the connector receiver holes are provided on the pair of first connector disposition face and the second connector disposition face; a height of the connector disposed on the first and second connector disposition faces is lower than a height of the first heat release fin and a height of the second heat release fin; a cable harness comprising a plurality of cables including a ground cable is connected to the at least one connector received in the plurality of connector receiver holes; and a connecting portion for the ground cable to be connected is provided near the connector receiver hole on the surface for the at least one connector to be connected.

According to the first aspect of the invention, since the connecting portion dedicated for the ground cable is provided near the connector on the surface of the case, when the cable harness is drawn out from the connector during maintenance, it is only necessary to detach the ground cable connected to the connecting portion by a screw and the like. Thus, unlike the conventional arrangement, it is not necessary to detach a large bolt for attaching the controller to an attachment board and the like, so that the maintenance can be facilitated. Further, when the ground cable is to be connected to the connecting portion, it is only necessary to attach the terminal of the ground cable with a screw. Accordingly, the screw can be firmly fastened while visually checking the connection between the terminal and the connecting portion, so that the terminal and the connecting portion can be reliably connected and a stable conduction between the ground cable and the case can be ensured.

According to the second aspect of the invention, since the height of the connector is lower than the height of the heat release fins and the connector does not protrude beyond the heat release fins, even when the controller is dropped onto the floor and the like, the heat release fin first hit the floor, so that the collision between the floor and the connector can be avoided and damages on the connector can be restrained, thereby ensuring reliable connection of the cable harness.

According to the third aspect of the invention, the following advantages can be obtained in addition to the advantages of the first and second aspects of the invention. Specifically, since the connector disposition face includes the first and second connector disposition faces, more number of connectors can be disposed, thereby allowing more number of connectors to be wired. In addition, since the first and second connector disposition faces respectively face the edges of the surface, the cable can be wired to pass through the edges, so that the first and second heat release fins are not covered by the cable harnesses, thereby maintaining favorable heat radiation performance.

DESCRIPTION OF EMBODIMENT(S)

Exemplary embodiment(s) of the invention will be described below with reference to the attached drawings.

Figure 1:
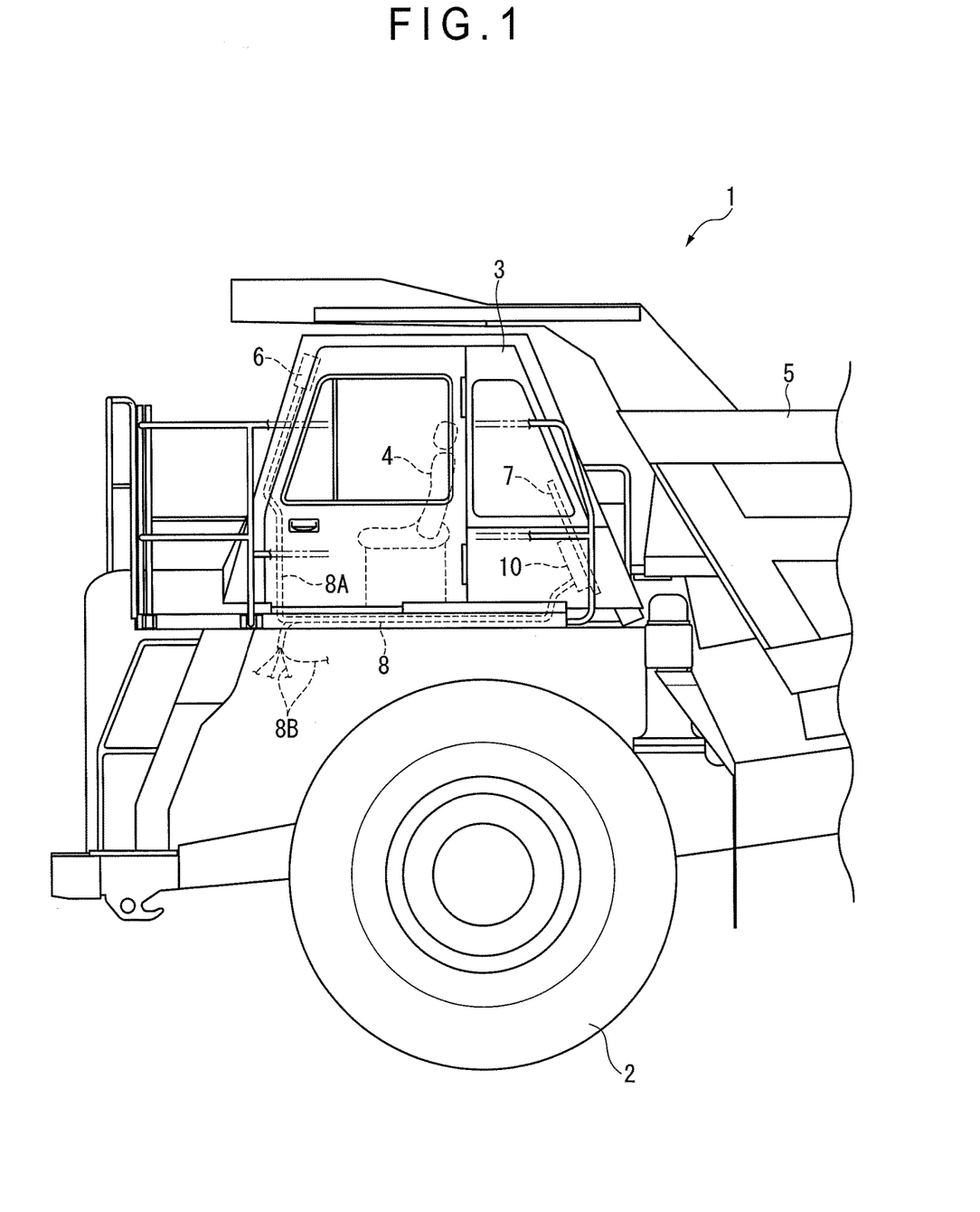
FIG. 1 is a side elevation showing a part of a construction machine according to an exemplary embodiment of the invention.

FIG. 1 shows a front part of a rigid dump truck (a construction machine in this exemplary embodiment).

As shown in FIG. 1, a dump truck 1 is provided with a cab 3 for an operator to get in at a position above a front wheel 2. Devices and machineries for traveling the dump truck 1 and tilting a body 5 are provided in the cab 3 in addition to an operator's seat 4 shown in a dotted line. Further, a monitor 6 shown in a dotted line is placed at an upper front part of an interior of the cab 3. A metal attachment board 7 is provided at a lower rear part of the interior of the cab 3. A controller 10 is attached to the attachment board 7.

The monitor 6 and the controller 10 are connected by a monitor cable 8A. An end of an image-signal cable 8B is connected to the controller 10. The other end of the image-signal cable 8B is connected to a plurality of monitoring cameras (not shown) mounted in the vehicle. The monitor cable 8A and the image-signal cable 8B are integrated into a cable harness 8. The image signals from the respective monitoring cameras are inputted to the controller 10 through the image-signal cable 8B. A predetermined processing is performed by the controller 10 based on the inputted image signals to generate display signals to be displayed on the monitor 6. The generated display signals are outputted to the monitor 6 through the monitor cable 8A to be displayed in a form of a desired image. In other words, the controller 10 in this exemplary embodiment is an image-processing controller.

Figure 2:
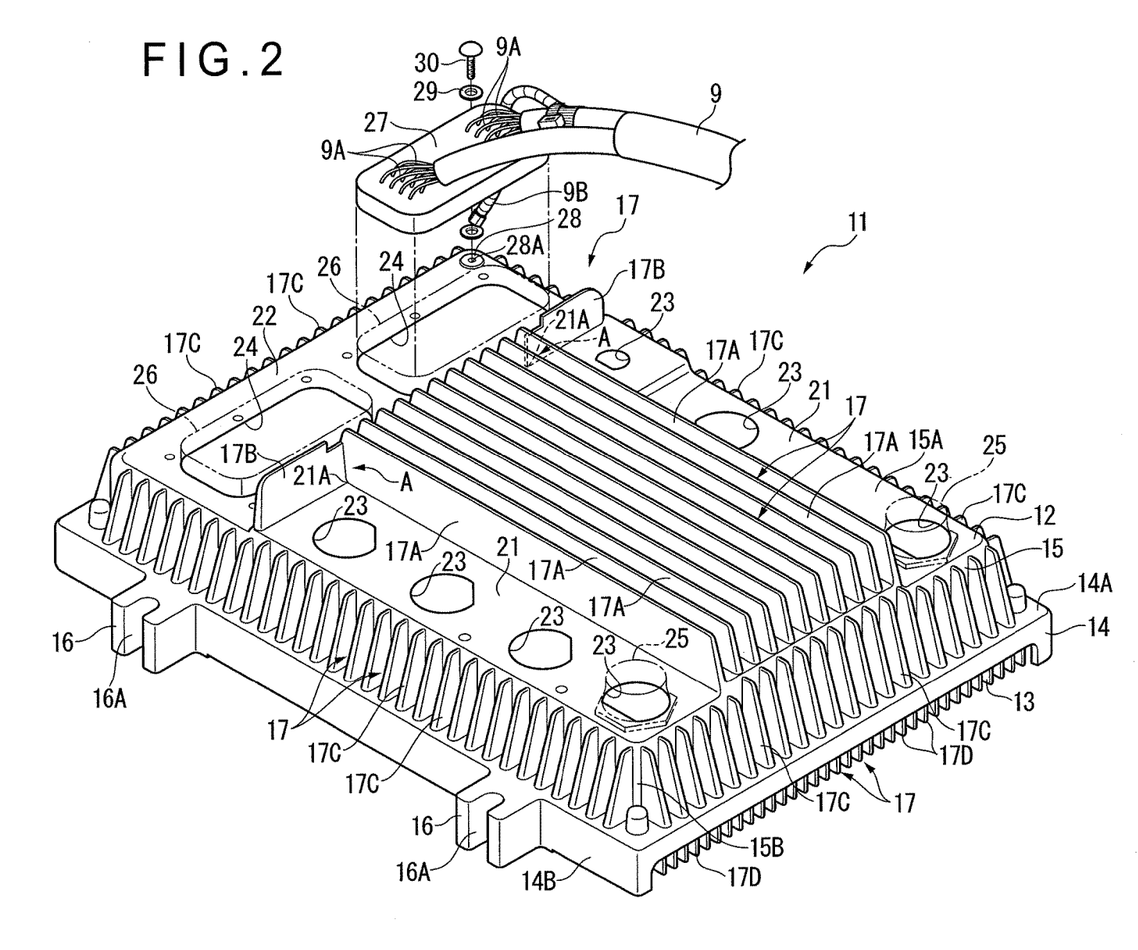
FIG. 2 is a perspective view showing a case of a controller mounted in the construction machine.
Figure 3:
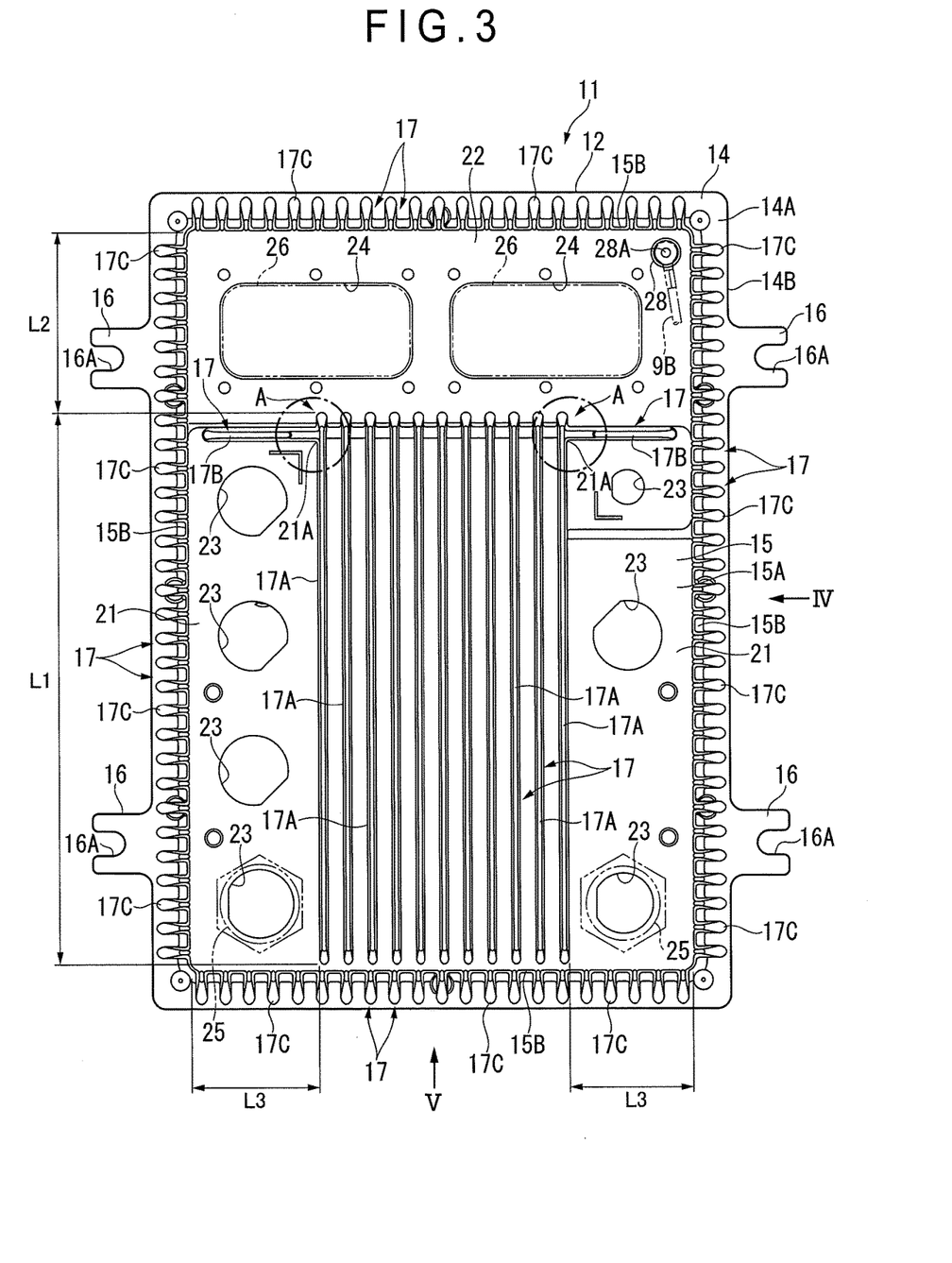
FIG. 3 is a plan view of the case.
Figure 4:
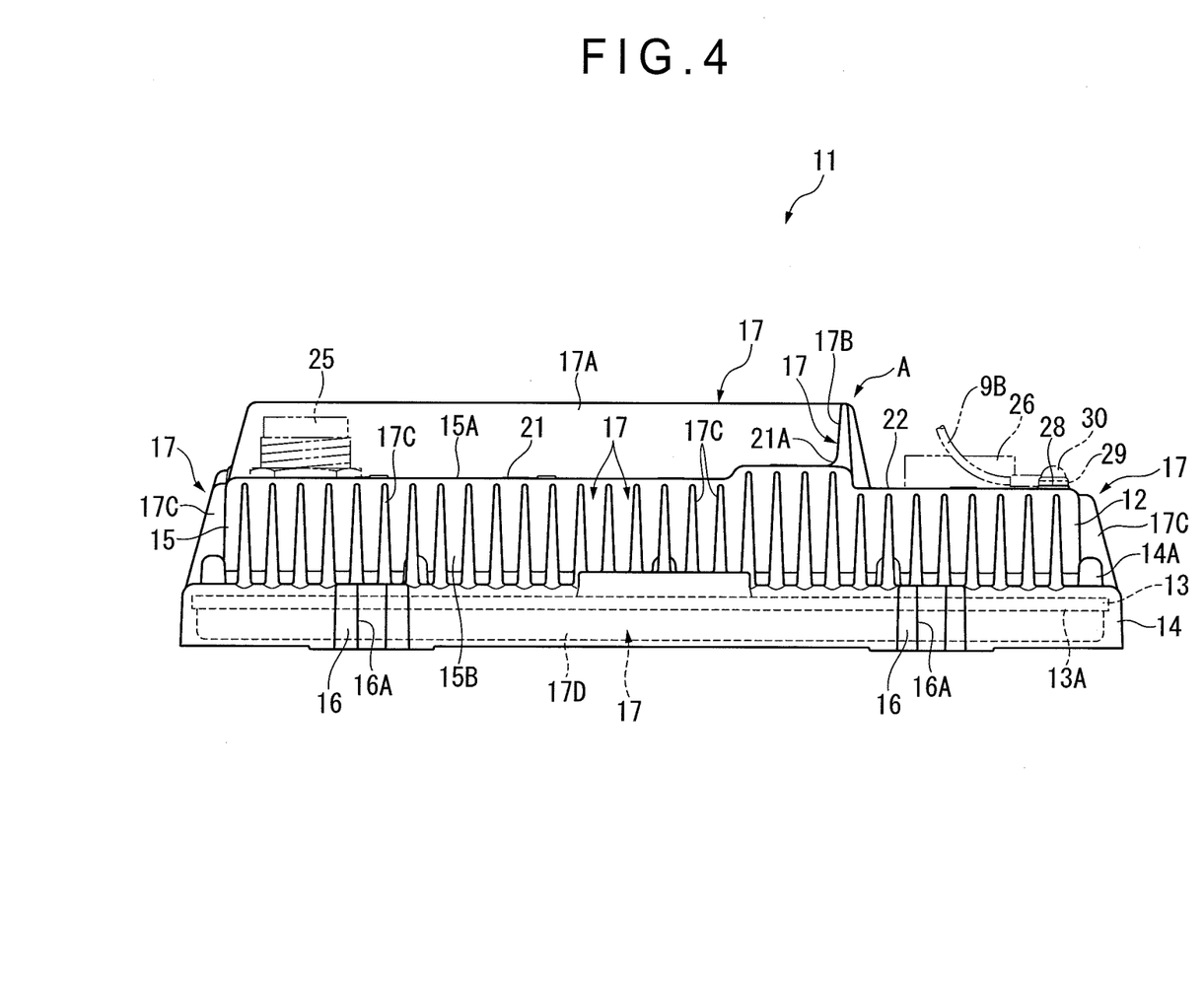
FIG. 4 is a side elevation of the case that is seen in a direction indicated by an arrow IV in FIG. 3.

FIGS. 2 to 5 show a case 11 of the controller 10 respectively in a form of a perspective view, a plan view, a side elevation seen in a direction indicated by an arrow IV in FIG. 3 and another side elevation seen in a direction indicated by an arrow V in FIG. 3.

As shown in FIGS. 2 to 5, the case 11 includes an upper case 12 in a form of a bottomless box and a lower cover 13 that is screwed to close a lower side of the upper case 12. Both of the upper case 12 and the lower cover 13 are made of aluminum die-casting.

A rectangular (in plan view) base 14 is provided on the upper case 12. An upwardly raised case body 15 is provided on an upper surface 14A of the base 14. Mounts 16 having a notch 16A in a form of an elongated hole horizontally project outward from side surfaces 14B of a pair of opposing long sides of the base 14. The entirety of the controller 10 is detachably attached to an attachment board 7 (FIG. 1) with bolts inserted through the notches 16A of the mounts 16.

On the other hand, an interior of the case body 15 similarly in a form of a rectangle (in plan view) defines an internal space of a predetermined volume. An electronic circuit board for generating the display signals of the monitor 6 is housed in the internal space. An integrated circuit such as an FPGA (Field-Programmable Gate Array) designed for image-processing is installed on the electronic circuit board. Since the electronic circuit board on which the integrated circuit is mounted is a heat-releasing component, in order to promote heat radiation from the heat-releasing component, a large number of heat release fins 17 (17A, 17B,17C,17D) are provided on the upper case 12 and the lower cover 13.

Specifically, a plurality of first heat release fins 17A parallel to edges of the long sides protrude from an upper surface 15A of the case body 15. The first heat release fins 17A have a length dimension L1 (FIG. 3). A first longitudinal end of the first heat release fins 17A reaches near an edge of one of short sides of the case body 15 while a second end thereof is spaced apart from an edge of the other one of the short sides of the case body 15 by a predetermined dimension L2 (FIG. 3). The predetermined dimension L2 of the spaced-apart portion is sized to be adapted to receive a later-described receptacle connector 26.

Further, the plurality of first heat release fins 17A (sometimes collectively referred to as first heat release fin 17A hereinafter) are juxtaposed along the short sides of the case body 15 and are centrally concentrated as a whole. In other words, the first heat release fin 17A is spaced apart from the edges of the long sides of the case body 15 by a predetermined dimension L3 (FIG. 3) on both sides in the juxtaposing direction (i.e. a direction in which the short sides extend). The predetermined dimension L3 is sized to be adapted to receive a later-described receptacle connector 25 and the like.

Further, a pair of second heat release fins 17B are provided on the upper surface 15A in the proximity of an end of the first heat release fin 17A near the receptacle connectors 26. The upper ends of the first and second heat release fins 17A and 17B are at the same height. The second heat release fins 17B extend in a crossing direction at a right angle relative to the first heat release fins 17A.

Specifically, a first end of one of the second heat release fins 17B continuously extends at a right angle from one of the first heat release fins 17A on a first side in the juxtaposing direction and a second end of the one of the second heat release fins 17B reaches near an edge of one of the long sides. Similarly, a first end of the other of the second heat release fins 17B extends at a right angle from one of the first heat release fins 17A on a second side in the juxtaposing direction and a second end of the other of the second heat release fins 17B reaches near an edge of the other of the long sides.

Thus, the first and second heat release fins 17A and 17B have intersections A at a portion encircled in FIG. 3 and are arranged in a T-shape in a plan view as a whole. Three ends of the T-shape extend to the both the edges of the longer sides and the edge of one of the short sides of the upper surface 15A. Incidentally, a plurality of rib-shaped third heat release fins 17C are provided on four side surfaces 15B of the case body 15 in a manner bridging across an upper surface 14A of the base 14. Further, a plurality of fourth heat release fins 17D are provided on a lower surface 13A of the lower cover 13 (FIGS. 4 and 5) facing downward.

Figure 5:
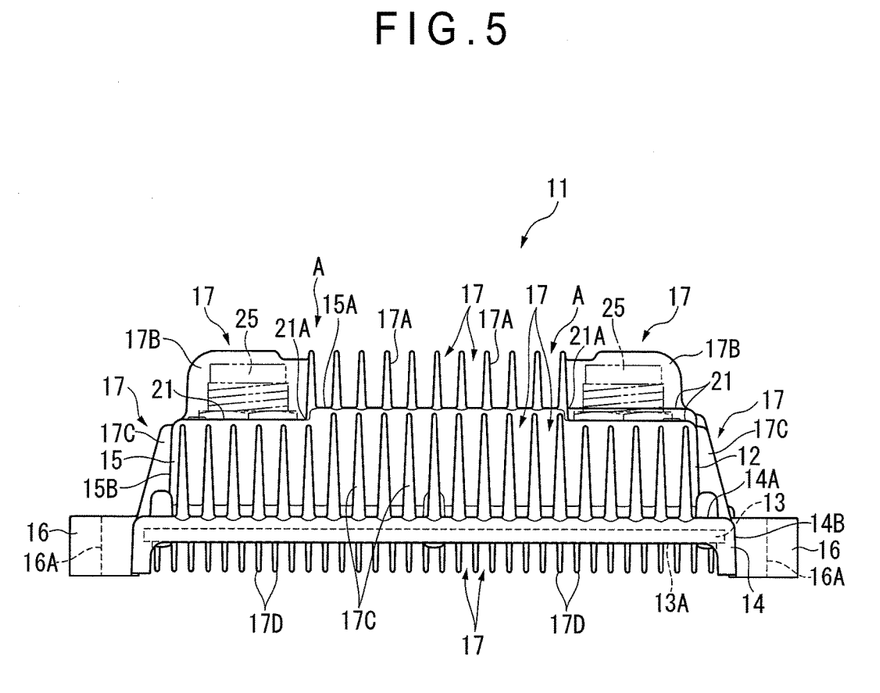
FIG. 5 is another side elevation of the case that is seen in a direction indicated by an arrow V in FIG. 3.

The fourth heat release fins 17D extend in parallel to an edge of long sides of the rectangular (in plan view) lower cover 13 and are provided all over the lower surface 13A. As shown in FIG. 5, an end of each of the fourth heat release fins 17D does not protrude from a lower surface (an attachment surface) of the mount 16 so as not to inhibit the controller 10 from being attached to the attachment board 7 (FIG. 1). The fourth heat release fin 17 is exposed from an opening at the short sides of the base 14, so that the radiated heat is dissipated through the opening between the base 14 and the attachment board 7.

The upper case 12 of this exemplary embodiment is arranged as follows for protecting the connector.

In the upper case 12, the first and second heat release fins 17A and 17B are placed on the upper surface 15A of the case body 15 in a T-shape, so that a pair of corners 21A defined by the intersections A of the first and second heat release fins 17A and 17B are formed on the upper surface 15A (the "surface"). The areas partitioned by the first and second heat release fins 17A and 17B define a pair of first connector disposition faces 21 including the corner 21A. The first connector disposition faces 21 are provided on both sides of the area in which the heat release fin 17A is provided, so that first connector disposition faces 21 face both the edge of the long side and the edge of the short side of the upper surface 15A.

Further, a second connector disposition face 22 located outside the area defined by the first and second heat release fins 17A and 17B and facing an edge of the other short side (i.e. an edge of the side to which the first heat release fin 17A is not extended) is provided on the upper surface 15A. Specifically, the second connector disposition face 22 is an area corresponding to the above-mentioned dimension L2, and is at a height slightly lower than that of the first connector disposition face 21.

A plurality of substantially circular connector receiver holes 23 are provided on the first connector disposition face 21. However, according to a specification of the controller 10, a part of the connector receiver holes 23 is sometimes used as an access hole in order to inspect, for instance, lighting condition of an LED installed on the electronic circuit board provided therein. A pair of rectangular connector receiver holes 24 are provided on the second connector disposition face 22.

As indicated in a two-dot chain line, a connector in a form of the receptacle connector 25 is received in the connector receiver hole 23 on the first connector disposition face 21. A plug connector attached with the monitor cable 8A (FIG. 1) is connected to the receptacle connector 25 on one of the first connector disposition faces 21. A plug connector attached with the image-signal cable 8B (FIG. 1) is connected to the receptacle connector 25 on the other of the first connector disposition faces 21.

When the receptacle connector 25 is attached, the height of the receptacle connector 25 is lower than the height of the first and second heat release fins 17A and 17B, so that an upper part of the receptacle connector 25 is not protruded from the first and second heat release fins 17A and 17B. Though the connector(s) received in the other connector receiver holes 23 is not illustrated, the relationship between the height of the non-illustrated connector(s) and the height of the first and second heat release fin 17A and 17B is the same as the above. The connectors not illustrated may not be the same as the receptacle connector 25, but may alternatively be a network cable connector or a USB (Universal Serial Bus) cable connector.

As indicated in a two-dot chain line, a receptacle connector 26 is received in the connector receiver hole 24 on the second connector disposition face 22. A plug connector 27 of a cable harness 9 is connected to the receptacle connector 26. The cable harness 9 is provided by integrating a plurality of conduction cables 9A including a power cable for supplying power to the electronic circuit board and a signal cable used for signal transmission between peripherals, and a ground cable 9B for a frame ground.

The height of the receptacle connector 26 is also lower than the height of the first and second heat release fins 17A and 17B when the receptacle connector 26 is attached to the connector receiver hole 24, so that an upper part of the receptacle connector 26 is not protruded from the first and second heat release fins 17A and 17B.

As described above, the height of the receptacle connectors 25 and 26 and the other connectors is lower than the height of the first and second heat release fins 17A and 17B in this exemplary embodiment. Thus, when the maintenance work of the controller 10 is performed in a narrow and less tidy work space in the cab 3 behind the operator's seat 4, even if the controller 10 is dropped so that the upper surface 15A hits the floor of the cab 3 (e.g. while handling the controller 10 without the cable harnesses 8 and 9 being connected), the first and second heat release fins 17A and 17B hit the floor. Thus, the connectors such as the receptacle connectors 25 and 26 do not collide with the floor, thereby avoiding the damages on the connectors.

Further, since the first and second connector disposition faces 21 and 22 on which the receptacle connectors 25 and 26 and the like are placed face the edges of the upper surface 15A, the cable harnesses 8 and 9 are wired from the first and second connector disposition faces 21 and 22 through the edges toward the outside. Thus, the first and second heat release fins 17A and 17B are not covered by the cable harnesses 8 and 9, so that the heat radiation performance is not impaired.

The upper case 12 of this exemplary embodiment further includes a connecting portion 28 for connecting the ground cable 9B near one of the connector receiver holes 24 on the upper surface 15A of the case body 15. An internal thread 28A is provided on the connecting portion 28. A screw 30 is inserted to a terminal of the ground cable 9B via a washer 29. The screw 30 is screwed into the internal thread 28A. Thus, the ground cable 9B is connected with the upper case 12, so that the entire case 11 including the lower cover 13 is grounded with the frame ground.

The case 11 has been typically grounded by, when the controller 10 is attached to the attachment board 7, holding the terminal of the ground cable 9B between the mount 16 provided to the upper case 12 and the attachment board 7 and fastening the terminal together with the mount 16 to electrically conduct the ground cable 9B and the case 11. On the other hand, the connecting portion 28 dedicated for the ground cable 9B is provided on the upper case 12 of the case 11 in this exemplary embodiment.

Thus, when the cable harness 9 is temporarily detached from the controller 10 in a narrow work space in this exemplary embodiment, it is not necessary to detach a large bolt for attaching the controller 10 but it is only necessary to detach the dedicated screw 30, so that the maintenance work can be facilitated. Further, when the ground cable 9B is to be connected, since the screw 30 can be fastened while visually checking the fastening portion of the terminal, the terminal can be firmly connected to the case 11 to ensure the electrical conduction between the ground cable 9B and the case 11, thereby stably grounding the case 11 to the frame ground.

Incidentally, it should be understood that the scope of the invention is not limited to the above-described exemplary embodiment(s) but includes modifications and improvements as long as the modifications and improvements are compatible with the invention.

Figure 6A:
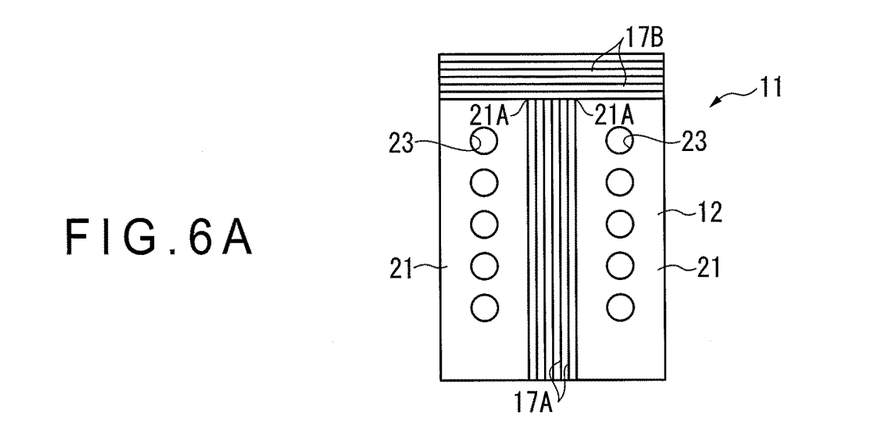
FIG. 6A is a plan view schematically showing a modification of the invention.

For instance, though the first and second heat release fins 17A and 17B are disposed in a T-shape so as to define the first and second connector disposition faces 21 and 22 on the upper surface 15A in the above exemplary embodiment, the first and second heat release fins 17A and 17B may be disposed in a T-shape all over the upper surface 15A so that only the pair of first connector disposition faces 21 are defined, as shown in FIG. 6A.

Figure 6B:
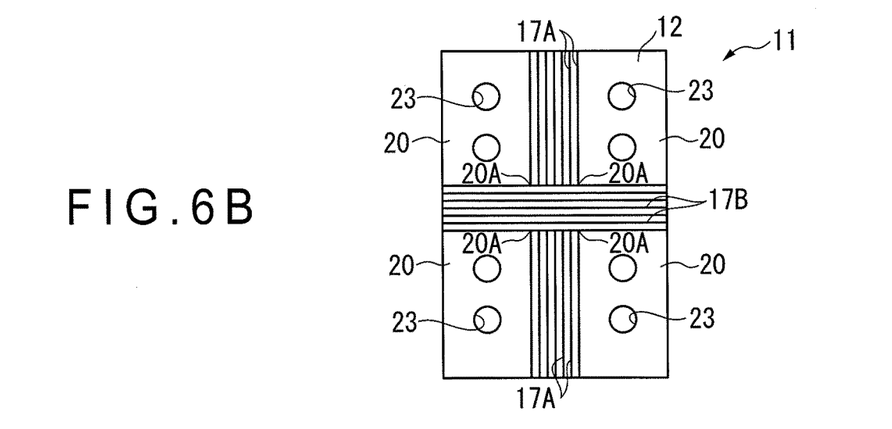
FIG. 6B is a plan view schematically showing another modification of the invention.
Figure 6C:
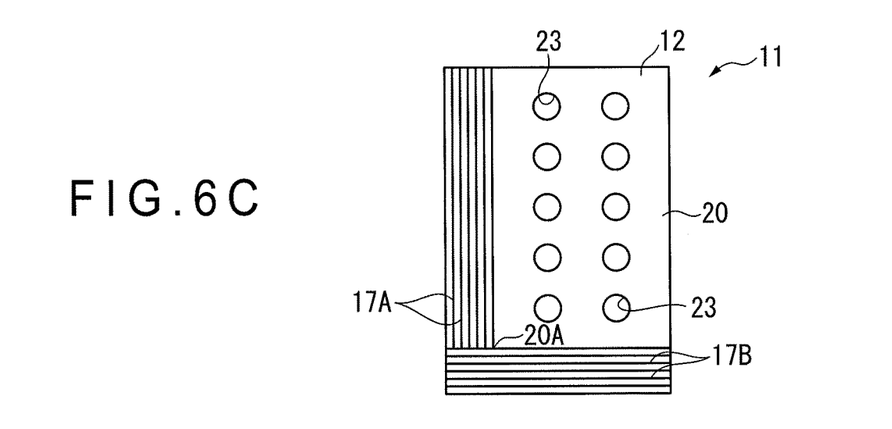
FIG. 6C is a plan view schematically showing still another modification of the invention.

Alternatively, as shown in FIG. 6B, the first and second heat release fins 17A and 17B may be disposed crosswise to define four connector disposition faces 20. Further alternatively, as shown in FIG. 6C, the first and second heat release fins 17A and 17B may be disposed in an L-shape to define a single large connector disposition face 20. Incidentally, the numeral "20A" in the figure denotes a corner portion.

In the above exemplary embodiment, the second heat release fin 17B is continuous with a part of the first heat release fins 17A. However, a small gap may be provided between the first and second heat release fins 17A and 17B and the first and second heat release fins 17A and 17B may be discontinuous thereat in an example of the invention.

Though the connecting portion 28 for connecting the ground cable 9B is provided at a single point in the above exemplary embodiment, for instance, a pair of connecting portions may be provided on a surface of the case being diagonally spaced apart from each other in order to ensure the grounding of the case with the frame ground. In the above arrangement, each of the cable harnesses connected to the connector near respective one of the connecting portions includes a ground cable.

Though the connecting portion 28 is provided on the upper surface 15A of the case body 15 in the above exemplary embodiment, when the connector receiver hole is provided on a side surface of the controller, the grounding portion of the ground cable may be provided near the connector receiver hole on the side surface. In other words, the surface on which the connector is to be disposed in the invention is not limited to the upper surface but may alternatively be the side surface.

In addition, the number of the connector receiver hole(s), the type of the connector and the cable harness, and the function of the electronic circuit board housed in the case are not limited to what has been described in the exemplary embodiment but may be determined as desired in view of the usage of the controller and the like.

The invention claimed is:

1. A ground structure of a controller that is mounted in a construction machine and is provided with a case comprising: a plurality of heat release fins provided on a surface of the case; and a plurality of connector receiver holes for receiving a connector being provided on the surface of the case, wherein the surface is rectangular in a plan view, the surface having a pair of opposing long edges and a pair of opposing short edges, the plurality of heat release fins comprises comprise a first heat release fin and a second heat release fin mutually intersected at an intersection and disposed in a crossing direction, the first heat release fin and the second heat release fin are continuous with each other and are provided to define a T-shape in an entirety thereof, opposing first and second ends of the T-shape extending to the two long edges of the surface, respectively, and a third end of the T-shape extending to one of the pair of opposing short edges of the surface, the surface is defined thereon with: a pair of first connector disposition faces each comprising a corner defined by the intersection and facing one of the long edges and the one of the pair of opposing short edges; and a second connector disposition face provided outside an area defined by the first heat release fin and the second heat release fin and facing another one of the pair of opposing short edges of the surface, the plurality of connector receiver holes are provided on the pair of first connector disposition faces and the second connector disposition face, a height of the connector disposed on the first and second connector disposition faces is lower than a height of the first heat release fin and a height of the second heat release fin, a cable harness comprising a plurality of cables including a ground cable is connected to the connector received in at least one of the plurality of connector receiver holes, and a connecting portion for the ground cable to be connected is provided near said at least one of the plurality of connector receiver holes on the surface for the connector to be connected.

2. A ground structure of a controller that is mounted in a construction machine and is provided with a case comprising: a plurality of heat release fins provided on a surface of the case; and a plurality of connector receiver holes for receiving a connector being provided on the surface of the case, wherein ends of the plurality of heat release fins extend to a plurality of edges of the surface, the surface is defined thereon with a connector disposition face, the connector disposition face being defined by the plurality of heat release fins in a manner to include a corner of the surface and the plurality of edges of the surface, the plurality of connector receiver holes are provided on the connector disposition face, a cable harness comprising a plurality of cables including a ground cable is connected to the connector received in at least one of the plurality of connector receiver holes, and a connecting portion for the ground cable to be connected is provided near said at least one of the plurality of connector receiver holes on the surface for the connector to be connected.

3. The ground structure according to claim 2, wherein a height of the connector disposed on the connector disposition face is lower than heights of the plurality of heat release fins.

4. The ground structure according to claim 2, wherein the plurality of heat release fins comprises a first heat release fin and a second heat release fin mutually intersected at an intersection and disposed in a crossing direction.

5. The ground structure according to claim 4, wherein the surface is rectangular in a plan view, the surface having a pair of opposing long edges and a pair of opposing short edges, and the first heat release fin and the second heat release fin are continuous with each other and are provided to define a T-shape in an entirety thereof, opposing first and second ends of the T-shape extending to the two long edges of the surface, respectively, and the third end of the T-shape extending to one of the two short edges of the surface.

6. The ground structure according to claim 4, wherein the surface is rectangular in a plan view, the surface having a pair of opposing long edges and a pair of opposing short edges, the surface is defined thereon with a plurality of the connector disposition faces, and the plurality of connector disposition faces comprises a first connector disposition face and a second connector disposition face, the first connector disposition face comprising a corner defined by the intersection and facing one of the long edges and one of the pair of opposing short edges, the second connector disposition face being provided outside an area defined by the first heat release fin and the second heat release fin and facing another one of the pair of opposing short edges of the surface.

7. The ground structure according to claim 2, further including a plurality of connector disposition faces defined by the plurality of heat release fins and includes a plurality of corners of the surface.

\* \* \* \* \*